United States Patent [19]

Robinson et al.

[11] Patent Number: 5,614,033
[45] Date of Patent: Mar. 25, 1997

[54] RIGID SOLAR PANEL WITH DISCRETE LATTICE AND CARRIER STRUCTURES BONDED TOGETHER

[75] Inventors: Stephen A. Robinson, North Hills; Stanley J. Krause, Northridge, both of Calif.

[73] Assignee: Hughes Aircraft Company, Los Angeles, Calif.

[21] Appl. No.: 512,727

[22] Filed: Aug. 8, 1995

[51] Int. Cl.$^6$ .................................................. H01L 31/052
[52] U.S. Cl. ........................... 136/246; 136/245; 428/73
[58] Field of Search ............................ 136/245, 246; 428/73; 244/173

[56] References Cited

U.S. PATENT DOCUMENTS 4,101,101  7/1978  Barkats et al. ........................ 244/173
4,394,529  7/1983  Gounder ................................. 136/245

Primary Examiner—Aaron Weisstuch
Attorney, Agent, or Firm—Elizabeth E. Leitereg; Terje Gudmestad; Wanda K. Denson-Low

[57] ABSTRACT

Discrete carrier and lattice structures are bonded together to form a lightweight rigid solar panel. The carrier includes a pair of electrically inert face sheets bonded on opposite sides of a thin thermoconductive honeycomb core. The face sheets provide an electrically inert surface for receiving a solar cell array and the honeycomb core forms a heat sink for conducting heat away from the solar cell array. The lattice includes a pair of patterned face sheets having a high elastic modulus bonded on opposite sides of a lattice base. The patterned face sheets provide axial stiffness and the lattice base separates them to provide bending stiffness. By splitting the solar panel into discrete carrier and lattice components, the present invention reduces the weight of existing solar panels by approximately 40% and increases power efficiency by approximately 10%.

21 Claims, 3 Drawing Sheets

RIGID SOLAR PANEL WITH DISCRETE LATTICE AND CARRIER STRUCTURES BONDED TOGETHER

BACKGROUND OF THE INVENTION

1. Field of the Invention

The present invention generally relates to rigid solar panels, and more specifically to a lightweight panel that includes a solar cell carrier, which also functions as a heat sink, mounted on a rigid lattice structure that provides both axial and bending stiffness.

2. Description of the Related Art

As shown in FIG. 1, a spacecraft 10 includes a number of rigid solar panels 12, which are shown in their deployed position. Solar arrays 14 which may include hundreds or thousands of solar cells 16 bonded to each solar panel 12 are used to provide electrical power to drive a variety of spacecraft systems and to recharge its batteries. The spacecraft rotates the solar panels 12 so that they receive direct illumination from the sun 18 to increase efficiency.

The solar cells 16 include a flat photovoltaic wafer made from n-type or p-type crystalline semiconductor material, such as silicon, gallium-arsenide or germanium in or on which a thin surface layer of the opposite conductivity type is formed. The interface between the surface layer and the main or bulk region of the wafer defines a semiconductor junction. Illumination of the thin surface layer causes a liberation of charge carriers, including electrons and holes in the region of the semiconductor junction, which migrate toward opposite surfaces to establish a potential across the solar cell.

The solar panel 12 has three primary functions. First, the panel provides a rigid support structure with sufficient axial and bending stiffness for carrying the solar cell array 14 through a dynamically active launch environment into orbit and positioning it to receive illumination. Secondly, the front surface of the solar panel 12 to which the array is bonded is electrically inert so that the individual solar cells 16 are electrically isolated. Lastly, the solar panel 12 serves as a heat sink to the space facing side (opposite sun 18) for the solar cell array.

There are a number of important issues associated with solar panel design. The heat sink capabilities of the panel must be sufficient to cool the solar cell array to maintain power efficiency. Known silicon solar cell arrays operate at approximately 12.5% (beginning of life) efficiency. The solar panel must have high axial and bending stiffness to provide a rigid support structure. The solar panel should have low and matched thermal expansion properties. The temperature on the illuminated side of the array can be as high as +55° C. and can be as low as −160° C. on the back surface, which faces deep space. Absent the desired thermal expansion properties, these temperature gradients could cause significant warping of the solar panel.

A paramount concern in solar panel design is weight. Existing spacecraft have eight solar panels, four per side, where the structural constituents weigh approximately 16.5 lbs (7.48 kg) per panel. Currently, the cost of flying a spacecraft can be estimated as high as $20,000 per pound over the lifetime of the spacecraft. Hence, the weight of the solar panel impacts the overall cost of operating a spacecraft.

FIG. 2 shows a section view of a known implementation of the rigid solar panel 12. The panel is made of a sandwich of two Kevlar® face sheets 20 and 22 bonded to opposite sides of an aluminum honeycomb core 24 and is 85" by 100" (2.16 m×2.54 m) in size. This integrated structure provides both a carrier for the solar cells 16 and a rigid support structure. The Kevlar® face sheets have a low thermal coefficient of expansion, and when bonded with equal thickness on either side of core 24 create a thermally "matched" structure. Furthermore, Kevlar® is electrically inert, and thus electrically isolates solar cells 16.

The panel's axial stiffness (S), preferably $1.9 \times 10^6$ lbs, is given by:

$$S = 2T \times W \times E \quad (1)$$

where T is the thickness of each face sheet 20 and 22, W is a normalized width, and E is the material's modulus of elasticity, which for Kevlar® is 3.5 million pounds per square inch (psi). To achieve adequate axial stiffness, the thickness T of each Kevlar® face sheet is chosen to be 0.0056 inches (0.14 mm). The two face sheets together weigh approximately 5.5 lbs (2.49 kg).

The panels's bending stiffness (B), preferably 0.96 lbxin², is given by:

$$B = T \times W \times E \times \left( \frac{D^2}{2} \right) \quad (2)$$

where D is the distance between face sheets 20 and 22. To provide sufficient bending stiffness, the sheets 20 and 22 must be separated by at least approximately 1 inch (2.54 cm), and hence the honeycomb core 24 has that thickness.

Besides providing the rigid support structure, the honeycomb core 24 also serves as the panel's heat sink. The thermal conductivity (Q) of the core, preferably 8.8 Btu-Hr-°F., is given by:

$$Q = \frac{kA}{L} \quad (3)$$

where k is the core material's coefficient of thermal conductivity in (80Btu hr °F.)/ft,
A is the cross-sectional area of the honeycomb in ft² and L is the thickness of the core in ft. Aluminum is the preferred core material because it is lightweight and has a high coefficient of thermal conductivity.

FIG. 3 shows the core's honeycomb pattern, which is chosen to both reduce the core's weight and conduct heat away from the solar cells to deep space. The size of the individual honeycomb cells 26 and their wall thickness 28 determine the cross-sectional area A. The core's thermal conductivity Q can be increased by reducing the solar cell size, which effectively increases A. However, this would significantly increase the weight of the core. Hence, the known core uses a ⅜ inch (0.95 cm) cell and has a weight of approximately 4.9 lbs (2.2 kg).

SUMMARY OF THE INVENTION

The present invention seeks to provide a light weight and efficient rigid solar panel that is compatible with existing spacecraft and maintains mechanical requirements.

This is accomplished with discrete carrier and lattice structures that are bonded together to form the rigid solar panel. The carrier includes a pair of electrically inert face sheets bonded on opposite sides of a thin thermoconductive honeycomb core. The face sheets provide an electrically inert surface for receiving a solar cell array and the honeycomb core forms a heat sink for conducting heat away from the solar cell array. The lattice includes a pair of patterned face sheets having a high elastic modulus bonded on opposite sides of a lattice base. The patterned face sheets provide axial stiffness and the lattice base separates them to provide bending stiffness.

By splitting the solar panel into discrete carrier and lattice components, the present invention reduces the weight of existing solar panels by approximately 40% and increases power efficiency by approximately 10%.

For a better understanding of the invention, and to show how the same may be carried into effect, reference will now be made, by way of example, to the accompanying drawings.

DETAILED DESCRIPTION OF THE INVENTION

In the present invention, the rigid solar panel includes discrete carrier and lattice structures that are bonded together. The carrier provides an electrically inert surface for receiving a solar cell array and provides a heat sink for conducting heat away from the solar cell array. The lattice provides a support structure with the desired axial and bending stiffness. The lattice and carrier are preferably thermally matched to reduce bending or warping in response to large thermal gradients.

By splitting the integrated solar panel of the prior art into discrete carrier and lattice structures, the present invention reduces the panel's overall weight significantly and increases its power efficiency by improving heat sinking capabilities. This is accomplished while maintaining compatibility with existing spacecraft deployment systems and mechanical design requirements. Furthermore, the carrier and lattice can be manufactured separately, which allows technicians to bond and wire the solar cell array to the carrier while others prepare the lattice's mechanical couplings for connection to the spacecraft. This substantially improves manufacturing efficiency.

Figure 5:
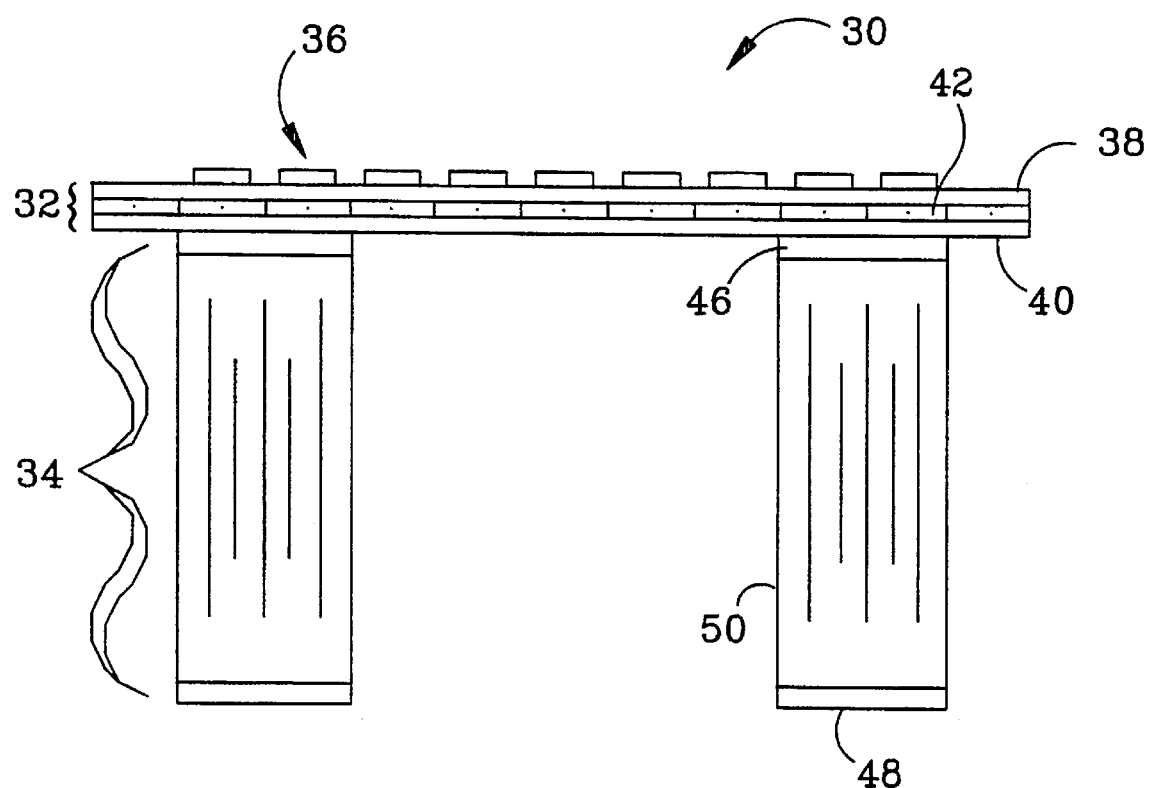
FIG. 5 is a section view of the rigid solar panel shown in FIG. 4.
Figure 4:
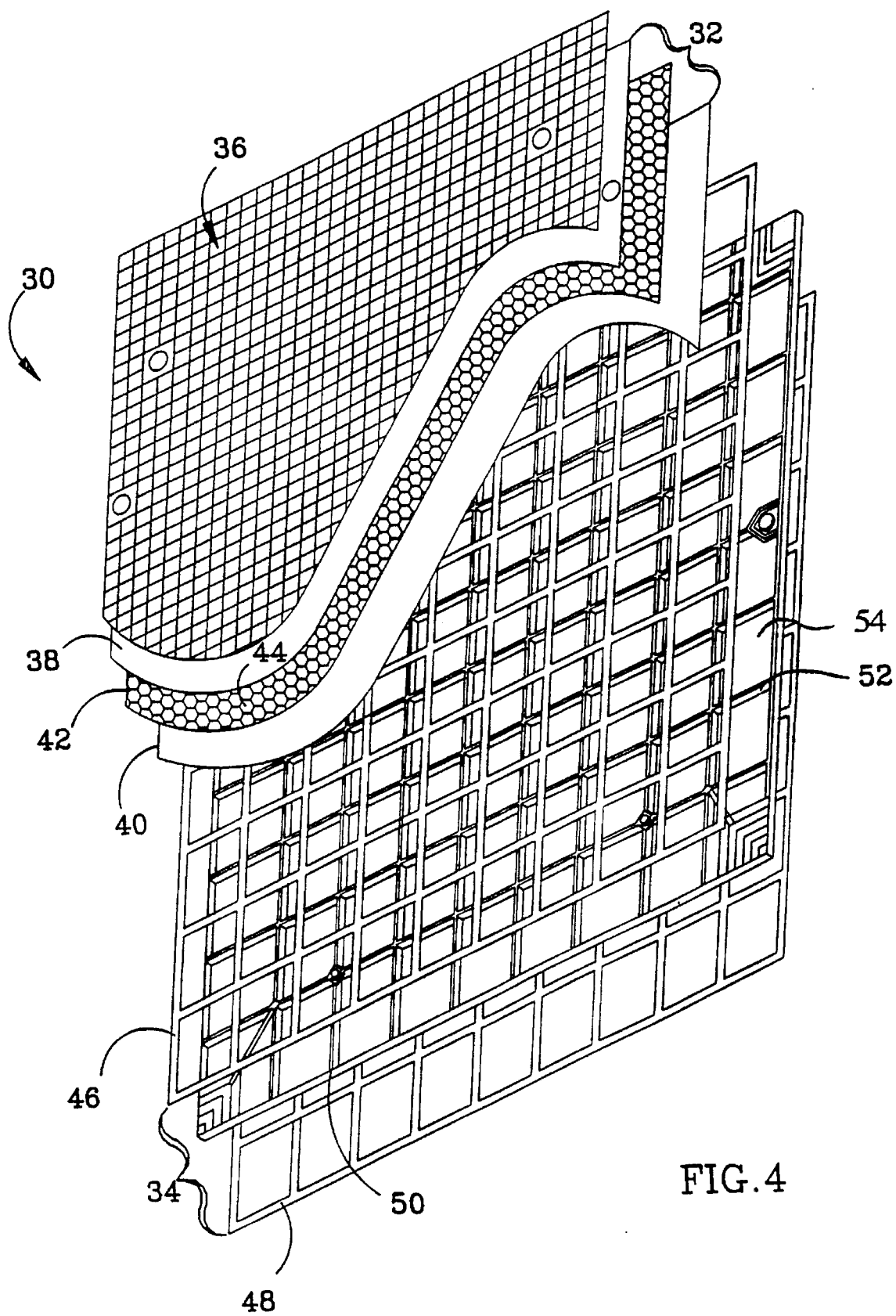
FIG. 4 is a perspective and exploded view of a rigid solar panel in accordance with the present invention.

As shown in FIGS. 4 and 5, a rigid solar panel 30 in accordance with the present invention includes a carrier 32 and a lattice 34. A solar cell array 36 is bonded to the front surface of carrier 32. The carrier 32 includes a pair of electrically inert face sheets 38 and 40 bonded on opposite sides of a thin thermoconductive honeycomb core 42. By itself the carrier does not provide adequate axial or bending stiffness.

Face sheet 38 provides a surface for mounting and electrically isolating the solar cells. Face sheet 40 on the backside of the carrier thermally balances the carrier so that it does not warp in the presence of a thermal gradient. The face sheets are formed from a material such as Kevlar® that has a low thermal expansion coefficient. Because the face sheets are not used to provide axial stiffness they can each be thinned from 0.0055 inches (0.14 mm) in the known panel to approximately 0.003 inches (0.08 mm) and is preferably at most 0.09 mm.

The honeycomb core 42 functions as a heat sink. As used herein the term honeycomb refers to any non-solid pattern. The preferred pattern has hexagonal, i.e. "honeycomb", shaped cells 44. Alternately, the pattern could be squares or some other geometric shape. The core is preferably formed from a light weight, high thermally conductive material such as aluminum.

Because the honeycomb core 42 is not being used to provide bending stiffness, it can be thinned from 1" in the known embodiments to approximately $L=1/16"$ (1.6 mm) and is preferably at most 2.5 mm. This greatly reduces the weight of the core so that the size of cells 44 can be reduced to preferably ¼" (6.35 mm). The core weight in the preferred embodiment is approximately 0.5 lb (0.23 kg). Reducing the cell size increases the amount of thermally conductive area A by approximately a factor of 1.5. Thus, the thermal conductivity Q, as given in equation 3, is increased by a factor of approximately 25. As a result, the power efficiency of the solar cells increases by approximately 10% from 12.5% to 14%, which over the lifetime of the spacecraft is very significant.

The lattice 34 includes a pair of patterned face sheets 46 and 48 bonded on opposite sides of a lattice base 50. The face sheets are used to provide the panel's axial stiffness, and hence are formed from a material such as graphite that has a high elastic modulus E. Because the elastic modulus E of graphite is much greater than that of Kevlar® (42 million v. 3.5 million), from equation 1 the product TxW can be reduced while still maintaining the desired axial stiffness S. Patterning the face sheets 46 and 48 to overlay the lattice sets W at the width of the lattice, approximately ⅜" (9.5 mm). To compensate for a smaller W, the thickness is set at approximately 0.0125 inches (0.32 mm). Manufacturing graphite patterned face sheets of this thickness is easier than manufacturing very thin sheets of graphite.

The lattice base 50 includes a plurality of ribs 52 that are spaced apart and interconnected to form a lattice framework. The ribs 52 are preferably ⅜" (9.5 mm) wide, and preferably not more than approximately 12.7 mm wide to maintain low weight, and define a square cell 54. Alternately, the cell could have a different geometric shape such as hexagonal. The ribs separate the face sheets 46 and 48 by approximately $D=1"$ (2.54 cm), which has been found to provide sufficient bending stiffness B as given by equation 2. In the preferred embodiment, the lattice base is approximately sixteen times thicker than the honeycomb core, and is preferably at least fourteen times thicker. The base also provides a small amount of heat sinking capability, but this is only a secondary effect.

To reduce the panel's overall weight, ribs 52 are spaced 9" to 12" (22.9 to 30.5 cm) apart, and preferably at least 25.4 cm. This is done without significantly reducing the bending stiffness or reducing the panel's heat sinking capability. Furthermore, the ribs 52 preferably have a honeycomb core with approximately a ⅛" (3.2 mm) cell, which is much lighter than a solid, core. The lattice base 50 is preferably formed from a lightweight thermally conductive material such as aluminum. The weight of the lattice base in the preferred embodiment is approximately 1.4 lb (0.64 kg). Thus, the total weight of the honeycomb core 42 and lattice base 50 is approximately 1.9 lb (0.86 kg), which is much less than the 4.9 lb weight of the honeycomb core in the known embodiment.

Table 1, shown below, summarizes the component weights of the present invention and known embodiment for a 85" by 100" solar panel.

TABLE 1

| Component | Invention | | Known | |
| --- | --- | --- | --- | --- |
| | lb | kg | lb | kg |
| Lattice | 4.6 | 2.1 | NA | |
| Core | 1.4 | 0.65 | | |
| Face Sheets (2) | 2.6 | 1.18 | | |
| Face Sheet Bond | 0.2 | 0.09 | | |
| Misc. | 0.4 | 0.18 | | |
| Carrier | 3.4 | 1.54 | 15.1 | 6.84 |
| Core | 0.5 | 0.23 | 4.9 | 2.22 |
| Face Sheets (2) | 1.5 | 0.68 | 5.5 | 2.49 |
| Face Sheet Bond | 1.2 | 0.54 | 2.9 | 1.32 |
| Misc. (corefill) | 0.2 | 0.09 | 1.8 | 0.81 |
| Epoxy Bonding | 0.6 | 0.27 | NA | |
| Misc. | 1.4 | 0.64 | 1.4 | 0.64 |
| Total Panel Weight | 10.0 | 4.55 | 16.5 | 7.48 |

Figure 1:
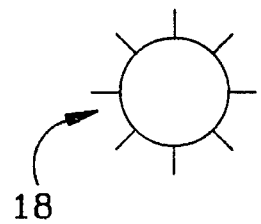
FIG. 1, described above, is a perspective view of a spacecraft with solar panels in a deployed position.
Figure 1:
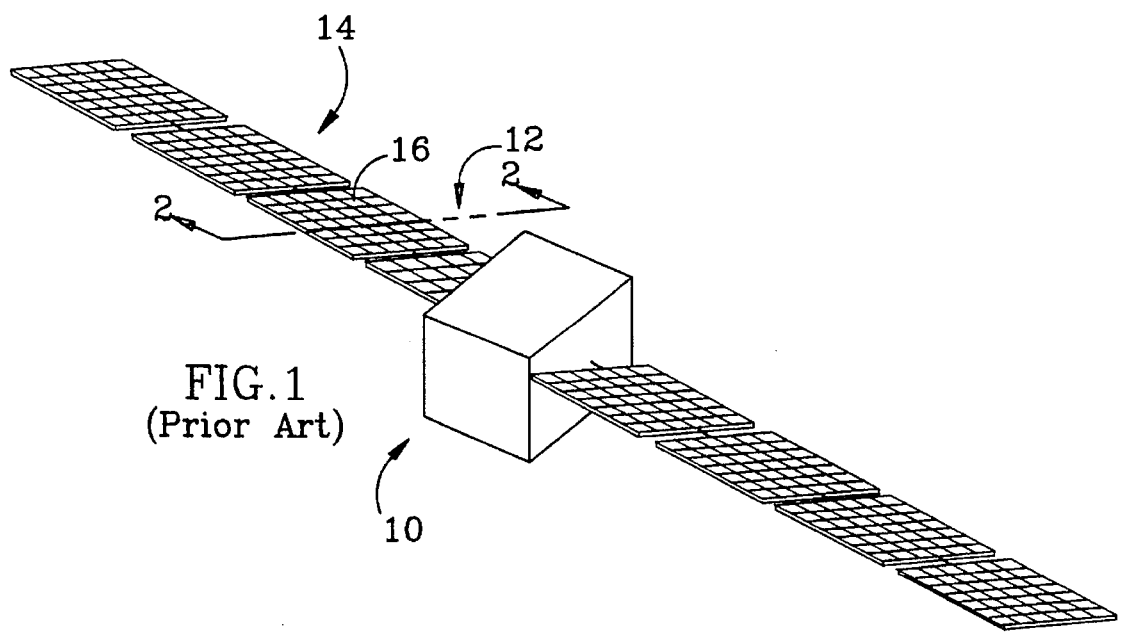
Figure 2:
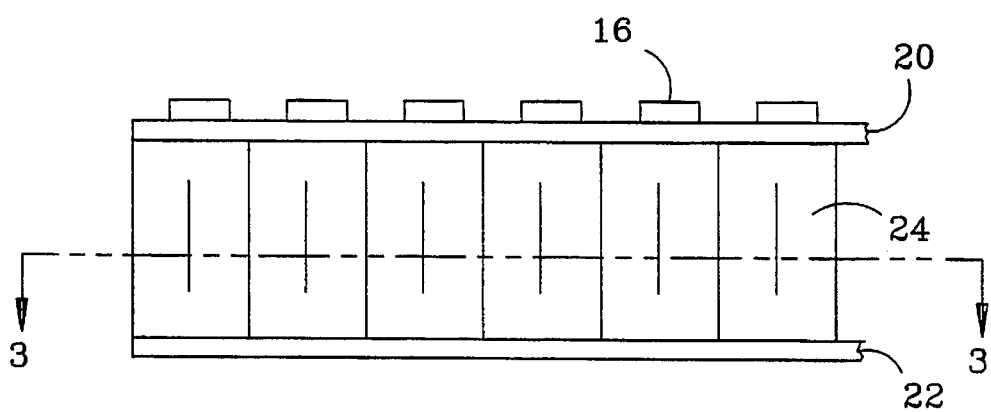
FIG. 2, described above, is a section view of a known rigid solar panel.
Figure 3:
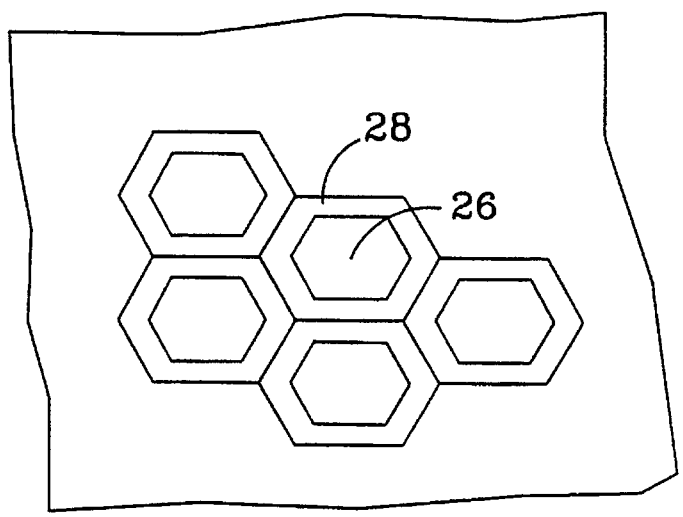
FIG. 3, described above, is a section view of the honeycomb core.

In the existing spacecraft shown in FIG. 1, the reduction of 6.5 lbs per panel will save as much as 1 million dollars over the lifetime of the spacecraft. The improvement in thermal conductivity which raises the solar cell efficiency from 12.5% to 14% also provides significant savings.

In an alternate embodiment, the lattice 34 is formed by providing a solid lattice base 50 made from material such as high conductivity graphite that has a high elastic modulus and removing the patterned face sheets 46 and 48. Because the lattice base is solid and formed from graphite, the top and bottom surfaces of the ribs replace the face sheets 46 and 48 and provide the desired axial stiffness. However, using solid ribs 52 with existing materials would increase the panel's overall weight. This could be overcome by increasing the spacing between the ribs, thinning the ribs, or by using as yet unknown light weight and stiff materials.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

We claim:

1. A rigid solar panel, comprising:

a lattice structure that includes first and second thin lattice patterned face sheets bonded to opposite sides of, mutually spaced apart by, and registered to a lightweight lattice-patterned core, said face sheets having an elastic modulus sufficiently high and being sufficiently spaced apart by said core that they provide substantially all of the solar panel's axial and bending stiffness, with said lightweight, lattice-patterned core serving as a spacer for said face sheets without itself contributing any substantial axial or bending stiffness to said lattice structure; and a carrier having an electrically inert front surface and a back surface that is bonded to the lattice structure's first face sheet, said carrier conducting heat away from said front surface.

2. The rigid solar panel of claim 1, wherein said carrier comprises third and fourth electrically inert face sheets bonded to opposite sides of a thermally conductive honeycomb core.

3. The rigid solar panel of claim 2, wherein said third and fourth face sheets have a thickness that absent the lattice structure would be insufficient to provide adequate axial stiffness.

4. The rigid solar panel of claim 3, wherein said third and fourth face sheets are made of Kevlar®.

5. The rigid solar panel of claim 4, wherein the thickness of the third and fourth face sheets is less than 0.09 mm.

6. The rigid solar panel of claim 3, wherein said thermally conductive honeycomb core has a thickness that absent the lattice structure would be insufficient to provide adequate bending stiffness.

7. The rigid solar panel of claim 6, wherein said thermally conductive honeycomb core is made of aluminum.

8. The rigid solar panel of claim 7, wherein the thickness of the thermally conductive honeycomb core is less than 2.5 mm.

9. The rigid solar panel of claim 6, wherein the thermally conductive honeycomb core has individual cells with a maximum diameter of 6.35 mm.

10. The rigid solar panel of claim 9, wherein the individual cells have a hexagonal shape.

11. The rigid solar panel of claim 1, wherein said lightweight lattice-patterned core is formed in one-piece to define a plurality of ribs that are spaced apart and interconnected to form a lattice framework that is registered to said first and second thin patterned face sheets which are each formed in one piece.

12. The rigid solar panel of claim 11, wherein said lightweight lattice-patterned core has individual cells with a minimum diameter of 3.2 mm.

13. The rigid solar panel of claim 12, wherein said lightweight lattice-pattern core is made of aluminum.

14. The rigid solar panel of claim 11, wherein said first and second face sheets and said lightweight, lattice-pattern core each have a plurality of ribs that are spaced apart and interconnected into respective lattice frameworks that are registered to each other, said ribs having a maximum width of 12.7 mm.

15. The rigid solar panel of claim 11, wherein said ribs separate said first and second face sheets by at least fourteen times the thickness of said carrier.

16. The rigid solar panel of claim 15, wherein said face sheets are made of graphite.

17. A rigid solar panel, comprising:

a carrier having first and second electrically inert carrier face sheets bonded to opposite sides of a thermally conductive honeycomb core, said face sheets having a known elastic modulus; and a lattice structure that includes first and second thin one-piece face sheets bonded to opposite sides of a lightweight one-piece core with said first thin face sheet bonded to said second carrier face sheet, said first and second thin face sheets and said lightweight core being patterned to define a lattice framework that supports said carrier and exposes said second carrier face sheet to conduct heat away from said carrier, said thin face sheets having a higher elastic modulus than said carrier face sheets so that they provide substantially all of the solar panel's axial stiffness and being separated by said lightweight core so that they provide substantially all of the solar panel's bending stiffness.

18. The rigid solar panel of claim 17, wherein the thicknesses of said carrier face sheets and thermally conductive honeycomb core are insufficient to provide axial and bending stiffness, respectively, absent said lattice structure.

19. The rigid solar panel of claim 18, wherein said lightweight, lattice-patterned core has a thickness at least fourteen times that of said thermally conductive honeycomb core.

20. The rigid solar panel of claim 17, wherein said thermally conductive honeycomb core has individual cells with a maximum diameter of 6.35 mm and said lightweight lattice-patterned core has individual cells with a minimum diameter of 3.2 mm.

21. The rigid solar panel of claim 17 wherein said thermally conductive honeycomb core and said lightweight, lattice-patterned are made of aluminum.

* * * * *